United States Patent
Glück et al.

(10) Patent No.: US 11,987,088 B2
(45) Date of Patent: May 21, 2024

(54) METHOD FOR OPERATING AT LEAST ONE ELECTROMECHANICAL ACTUATOR OF A MOTOR VEHICLE AND MOTOR VEHICLE

(71) Applicant: AUDI AG, Ingolstadt (DE)

(72) Inventors: Christian Glück, Ingolstadt (DE); Viktor Kell, Neustadt (DE)

(73) Assignee: AUDI AG, Ingolstadt (DE)

( * ) Notice: Subject to any disclaimer, the term of this patent is extended or adjusted under 35 U.S.C. 154(b) by 332 days.

(21) Appl. No.: 17/590,615

(22) Filed: Feb. 1, 2022

(65) Prior Publication Data
US 2022/0242188 A1 Aug. 4, 2022

(30) Foreign Application Priority Data
Feb. 2, 2021 (DE) .......................... 102021102352.1

(51) Int. Cl.
*B60G 17/015* (2006.01)
*B60L 50/50* (2019.01)
*G01R 19/00* (2006.01)

(52) U.S. Cl.
CPC ............ *B60G 17/015* (2013.01); *B60L 50/50* (2019.02); *B60G 2202/42* (2013.01); *G01R 19/0046* (2013.01)

(58) Field of Classification Search
CPC .. B60G 17/015; B60G 17/06; B60G 2202/42; B60L 50/50; B60L 1/20
See application file for complete search history.

(56) References Cited

U.S. PATENT DOCUMENTS

| | | | | |
|---|---|---|---|---|
| 6,952,060 B2* | 10/2005 | Goldner | ............. | B60G 17/0157 310/15 |
| 7,202,577 B2* | 4/2007 | Parison | .................. | H02K 33/16 417/413.1 |
| 7,688,036 B2* | 3/2010 | Yarger | .................... | H02J 7/345 369/13.02 |
| 7,938,217 B2* | 5/2011 | Stansbury, III | ........... | F03G 7/08 180/165 |
| 8,344,526 B2* | 1/2013 | Bhat | ...................... | H02N 2/186 290/1 R |
| 8,941,251 B2* | 1/2015 | Zuo | ........................ | H02K 35/02 290/1 R |
| 9,120,361 B2* | 9/2015 | Willems | .................... | B60G 7/02 |
| 9,541,154 B2* | 1/2017 | Willems | ................. | B60G 13/16 |

(Continued)

FOREIGN PATENT DOCUMENTS

| | | |
|---|---|---|
| CN | 105818708 A | 8/2016 |
| DE | 101 21 962 A1 | 11/2002 |

(Continued)

*Primary Examiner* — Erez Gurari
(74) *Attorney, Agent, or Firm* — Seed IP Law Group LLP

(57) ABSTRACT

A method for operating at least one electromechanical actuator of a motor vehicle, wherein the actuator is designed to convert mechanical power into electrical power during operation of the motor vehicle in stochastic feed-in processes as a function of a feed-in efficiency predetermined by a feed-in operating point of the actuator, which electrical power is fed into an energy storage device of the motor vehicle, includes detecting the start of a feed-in process by a means of detection and, at the start of the feed-in process, setting a feed-in operating point of the actuator, wherein the feed-in efficiency is 50% or less.

14 Claims, 2 Drawing Sheets

(56) References Cited

U.S. PATENT DOCUMENTS

| | | | |
|---|---|---|---|
| 9,689,381 B2* | 6/2017 | Nulman | F03G 7/08 |
| 10,690,215 B2* | 6/2020 | Sakka | B60G 13/14 |
| 11,290,032 B1* | 3/2022 | Iriarte | B60G 13/08 |
| 11,338,637 B2* | 5/2022 | Dhaens | B60G 17/08 |
| 2013/0161957 A1* | 6/2013 | Bhat | H02N 2/186 |
| | | | 290/55 |
| 2022/0203844 A1* | 6/2022 | Sujan | H01M 16/003 |
| 2022/0242188 A1* | 8/2022 | Glück | B60L 50/50 |

FOREIGN PATENT DOCUMENTS

| | | |
|---|---|---|
| DE | 10 2016 117 153 A1 | 3/2017 |
| EP | 2 097 304 B1 | 9/2011 |
| KR | 10-2018-0008970 A | 1/2018 |

* cited by examiner

METHOD FOR OPERATING AT LEAST ONE ELECTROMECHANICAL ACTUATOR OF A MOTOR VEHICLE AND MOTOR VEHICLE

BACKGROUND

Technical Field

Embodiments of the invention relate to a method for operating at least one electromechanical actuator of a motor vehicle, wherein the actuator is designed to convert mechanical power into electrical power, which electrical power is fed into an energy storage device of the motor vehicle, during operation of the motor vehicle in stochastic feed-in processes, as a function of a feed-in efficiency predetermined by a feed-in operating point of the actuator. Furthermore, embodiments of the invention relate to a motor vehicle.

Description of the Related Art

If stochastic and/or highly dynamic loads are integrated into an electrical energy system of a motor vehicle, energy fed back into the energy system by these loads may need to be taken into account in the form of a capacity reserve in an energy storage device of the energy system. In so doing, this capacity reserve represents a portion of the total capacity of the energy storage device, which serves to absorb the electrical energy generated by the stochastic actuator. The reserve ensures stability of the energy system, since it is not overloaded by stochastic and thus unpredictable feed-back processes if the energy fed in can be absorbed by the energy storage. A disadvantage, however, is that the reserve reduces the total capacity of the energy storage system that can be used for other purposes.

Various methods for handling energy fed into an onboard electrical system of a motor vehicle are known from the prior art.

KR 20180008970 A describes a mechanism for controlling a braking current fed into an onboard electrical system of a motor vehicle. In the event of insufficient charging capacity of individual battery cells of an energy storage device of the motor vehicle, a bypass means of the mechanism is actuated so that the braking current is converted into heat via a resistor. A feed-in into the bypassed battery cell is thus avoided.

A method of charging a battery is known from CN 105818708 A. In this case, a current generated by an electric motor connected to the battery is supplied to a heating device when a temperature of the energy storage device is lower than a predetermined limit value. If the limit value is exceeded, the current is fed to the battery instead.

DE 10 2016 117 153 A1 discloses a method for conditioning a vehicle battery of a hybrid vehicle with an electrically driven cooling system. When the temperature of the battery is higher than a predetermined threshold value, at least a portion of a current generated by the electric motor in a regenerative braking operation is not fed into the battery, but rather is directed to the cooling system to cool the battery.

BRIEF SUMMARY

Some embodiments provide a method which enables a reduction of a reserve in the capacity of an energy storage device.

In some embodiments, the start of a feed-in process is detected by a means of detection and, at the start of the feed-in process, a feed-in operating point of the actuator is set in which the feed-in efficiency is 50% or less.

This enables that only a small proportion of the mechanical power acting on the actuator is still converted into electrical power due to the low feed-in efficiency. This reduces the electrical power that is delivered in the feed-in process to the energy storage system or alternatively to an onboard electrical system of the motor vehicle comprising the energy storage system. As a consequence, the reserve that must be allocated in the energy storage device to absorb this power is also reduced. Stability of the energy storage system or alternatively of an onboard electrical system of the motor vehicle comprising the energy storage system can thus be achieved even without or with only a smaller reserve in the energy storage system.

The electromechanical actuator of the motor vehicle is thereby connected to the energy storage device, for example, via an onboard electrical system of the motor vehicle, such that electrical energy can be transferred from the actuator to the energy storage device in the feed-in processes. The feed-in processes of the electromechanical actuator occur stochastically, whereby stochastic in this context means that the points in time and the number or alternatively the frequency of the feed-in processes are not determined or cannot be determined by the motor vehicle. This can be caused, for example, by the fact that the occurrence of the respective feed-in processes is due to unforeseeable and/or undetected or undetectable influences acting on the motor vehicle. The stochastic feed-in processes can, in particular, occur with actuators which do not serve for vehicle propulsion or which are not traction motors of the motor vehicle.

The electromechanical actuator may therefore be different from a traction motor of the motor vehicle. In the case of a traction motor of a motor vehicle, there are generally no stochastic feed-in processes, since the engine or alternatively the generator operation of the traction motor occurs in a deterministic manner and it is accordingly known at all times in a control device designed to operate the motor, the operating state of which is available, or which operating state is set in the event of a subsequent change in operating parameters. An actuator of the type in question can, for example, be an adaptive damping device or alternatively an adaptive suspension damper, but can also be any other actuator different from the traction motor.

The means of detection can be used to detect the start of a feed-in process, such that a start of a feed-back of electrical power via the actuator into the onboard electrical system can be detected before the electrical power, or at least a substantial part of the electrical power, is fed into the energy storage device and/or generated by the actuator. When the start of such a feed-in process is detected by the means of detection, then a feed-in operating point of the actuator is set at which the feed-in efficiency is 50% or less. The feed-in efficiency indicates the proportion of mechanical power that is converted into electrical power. With a feed-in efficiency of 50%, half of the mechanical power is converted into electrical power by the actuator. The remaining half is converted into thermal power, which, for example, causes the actuator to heat up. As a consequence, a feed-in efficiency of less than 50% means that more thermal power than electrical power is generated from the mechanical power.

The feed-in efficiency can also be considered in reference to a conversion of mechanical energy into electrical energy or thermal energy, since the time in which the respective powers are generated or converted is the same for all three forms of energy or corresponds to the duration of the feed-in process. As a consequence, the feed-in efficiency can also be considered as the portion of the mechanical energy that is converted into electrical energy via the actuator, wherein the remaining portion is converted into thermal energy or alternatively heat.

The thermal power, which arises due to the low feed-in efficiency, causes the actuator and/or components coupled to the actuator to heat up and therefore does not need to be absorbed by the energy storage device. An absorption of the thermal power occurs via the thermal capacity of the actuator and other components of the vehicle connected to the actuator. The remaining proportion of electrical power that is fed in is therefore significantly lower than with a higher feed-in efficiency, such that the proportion of the total capacity that must be made available as a reserve in the energy storage system can be reduced. This increases the capacity available for other functions of the energy storage device, in particular for energy absorption from an electric traction motor of the motor vehicle.

It is further achieved that the stochastically occurring feed-in processes of the actuator do not cause limit values to be exceeded in the load of the energy storage device or alternatively of one of the energy storage devices and the onboard electrical system comprising at least one actuator. By avoiding the exceeding of stochastic or alternatively non-deterministic limit value during the feed-in processes of the electromechanical actuator, the occurrence of instabilities in the onboard electrical system can be avoided. States in which an increased component load and/or further critical effects occur can also be avoided.

The greater usable capacity of the energy storage system resulting from the reduction in size and/or the elimination of the reserve can, in particular, lead to optimization of the energy regeneration phases of the vehicle. This can improve the $CO_2$ potential and the overall efficiency of the motor vehicle, since a larger capacity of the energy storage device is available for other functions, in particular, for the absorption of electrical power or alternatively energy generated in a regenerative operation of a traction electric motor of the motor vehicle.

The feed-in operating point can occur as a function of a desired mechanical behavior of the actuator in the feed-in process and/or of an actuator parameter to be set. In this way, a mechanical behavior of the actuator can be preset at the feed-in point. The mechanical behavior of the actuator can thereby also be generated with the reduced feed-in efficiency. The desired mechanical behavior of the actuator and/or of the actuator parameter to be set can thereby be determined, for example, by a control device set up to carry out the method or can be transmitted to such a control device by a further control device.

In some embodiments, the feed-in efficiency can be 25% or less at the set feed-in operating point. In particular, the feed-in efficiency at the set feed-in operating point may also be 20% or less, 15% or less, 10% or less, 5% or less, 2% or less, or 1% or less.

The feed-in efficiency may be selected to be as low as possible so that the electrical power generated in the feed-in processes or the amount of electrical energy generated in the feed-in processes is kept as low as possible. In particular, a feed-in efficiency of 0% or at least essentially 0% is possible, so that all mechanical power acting on the actuator is converted into thermal power via the actuator and no or virtually no electrical power needs be fed into the energy storage system. The lower the feed-in efficiency in the feed-in processes, the lower the reserve can be for the at least one electromagnetic actuator in the energy storage system. At a feed-in efficiency of 0%, the reserve can be dispensed with completely.

In some embodiments, an actuator is used which is designed to be operated in actuator operating processes in at least one actuator operation operating point during operation of the motor vehicle, wherein, in each case, an operating efficiency with which the actuator converts electrical power into mechanical power is specified by the actuator operation operating points and, in each case, the operating efficiency is 80% or more.

The operating efficiency thereby relates to the conversion of electrical power into mechanical power, wherein the proportion of electrical power that is not converted into mechanical power is correspondingly converted into thermal power in the actuator. An operating efficiency with which the actuator is operated in the actuator operating processes may be selected to be as high as possible, such as being 80% or more. In this way, the at least one actuator can be operated in the actuator operating processes as efficiently as possible from the energy storage device, such that the electrical power which is taken from the energy storage device can be converted in an optimal manner into the mechanical power required to implement the required function of the actuator, and unnecessary extraction of energy from the energy storage device for actuator operation of the actuator can be avoided. Correspondingly to the feed-in operating point, the actuator operation operating point can also be selected as a function of a desired mechanical behavior of the actuator.

In some embodiments, the duration of the feed-in processes generated by the actuator during operation of the motor vehicle is 10 ms or less, in particular 1 ms or less, and/or that mechanical powers of 1 kW or more can be converted by the actuator in the feed-in processes.

The use of the lowest possible feed-in efficiency is particularly useful for electromechanical actuators, which feed into the electrical energy storage device in a highly dynamic manner, which is to say, with comparatively short feed-in times. Furthermore, with such actuators the necessary reserve is particularly large if comparatively large mechanical powers of 1 kW or more can be converted into electrical powers in the feed-in processes and can thus be fed back into the energy storage device.

In some embodiments, an electromechanical actuator is used, which actuator is connected to the energy storage device via a control mechanism, wherein the feed-in operating point of the electromechanical actuator is set by actuating the control mechanism. For this purpose, for example, the control device can be connected to a control mechanism designed to carry out a method as described herein or can comprise such a control device. The control mechanism can be designed, for example, as a converter with which a direct current taken from the energy storage device can be converted in the actuator operating processes into an alternating current for operating the electromechanical actuator, or by means of which an alternating current generated by the electromechanical actuator can be converted in the feed-in processes into a direct current. The actuator can thereby be designed as an electrical machine, for example, as a rotary motor or as a linear motor.

In some embodiments, an adaptive damping device, in particular an adaptive suspension damper, is used as the electromechanical actuator. An adaptive damping device such as an adaptive suspension damper can be used to generate a deflection of the damping device at each of the actuator operation operating points. In the feed-in processes, the damping device is, for example, compressed or squeezed together, such that, in reverse to the movement in an actuator operation operating point, a conversion of mechanical power into electrical power takes place.

An actuator designed as an adaptive damping device or alternatively as an adaptive suspension damper can, for example, comprise an electrical machine. In addition, such an actuator may even comprise further elements, for example, one or more springs and/or one or more mechanical components, for example, a compressible or alternatively extendible linkage, a piston or the like. In the case of an adaptive damping device or alternatively an adaptive suspension damper, the adjustment of the feed-in operating point can take place as a function of a damping behavior that is to be set.

An adaptive suspension damper, which is used as an electromechanical actuator, and/or other adaptive damping devices of a motor vehicle can be controlled depending on the current driving state of the motor vehicle. The deflection processes or alternatively the feed-in processes of the electromechanical actuator also take place as a function of the current operating state, wherein these processes are stochastic and cannot be predicted by a control device of the motor vehicle as regards the points in times and/or the frequency of their occurrence and/or the respective mechanical power to be converted.

This is due in particular to the fact that adaptive damping devices, in particular adaptive suspension dampers, can be excited by unevenness of the road surface during operation of the motor vehicle. In particular, the deflection processes associated with the feeding in of energy into the energy storage device are highly dependent on the nature of a road surface or the road surface being driven on in terms of the points in time and frequency of their occurrence and the mechanical power absorbed by the actuator in each case. It is possible for the method to be used with several adaptive damping devices of a motor vehicle, for example, with four adaptive suspension dampers each assigned to one wheel of the motor vehicle.

In some embodiments, a current measuring device can be used as a means of detection, wherein a current can be measured by the current measuring device, which is generated by the actuator during the feed-in process. By measuring a current which is generated by the actuator, the start of a feed-in process can be detected, such that the feed-in operating point of the actuator can accordingly be adjusted, for example, by controlling the control device connected to the actuator. The means for measuring the current can also be used in the actuator operation processes and can be used there, in particular, for adjusting an actuator operation operating point, so that no additional sensor is required as a means of detection.

In some embodiments, during the detection of the start of a feed-in process, an actuator control device assigned to the actuator determines a torque to be set by the actuator, wherein the feed-in operating point is set as a function of the determined torque. Depending on the design of the actuator, the actuator control device can be, for example, a suspension control system or a damping device control system. The actuator control device can determine a torque to be set or absorbed by the actuator, for example, as a function of a current driving state of the motor vehicle and/or as a function of at least one measured value of the means of detection when detecting the start of the feed-in process. Correspondingly, the actuator control device can also determine a torque to be set at an actuator operation operating point, which torque is generated via the actuator when the actuator operation operating point is set.

A motor vehicle may comprise at least one electromechanical actuator, an energy storage device, a means of detection and a control device, wherein the actuator is designed to convert mechanical power into electrical power during operation of the motor vehicle in stochastically occurring feed-in processes as a function of a feed-in efficiency predetermined by a feed-in operating point of the actuator, which electrical power is fed into the energy storage device, wherein the start of a feed-in process can be detected by the means of detection, wherein the control device is designed to carry out a method as described herein.

In some embodiments, the energy storage device is a traction energy storage device and/or that the motor vehicle is a hybrid-electric or an fully electric motor vehicle. In the case of a hybrid-electric motor vehicle which, in addition to an electric traction motor, also comprises a traction motor in the form of an internal combustion engine, electric energy storage devices with a lower total capacity are generally installed, so that a reduction in the reserve in the energy storage device as a percentage of the total capacity of the energy storage device is particularly significant. In fully electric vehicles, which can exclusively be driven by at least one electric traction motor, energy storage devices with a larger total capacity are generally used. In this case, too, the reduction or elimination of a reserve has an advantageous effect, as it increases the usable total capacity and thus, in particular, the possible range of the fully electric vehicle can be increased.

All of the advantages and embodiments described above with respect to methods apply accordingly to motor vehicles. Conversely, the explanations regarding motor vehicles also apply accordingly to methods.

BRIEF DESCRIPTION OF THE SEVERAL VIEWS OF THE DRAWINGS

Further advantages and embodiments are described below and illustrated in the drawings.

DETAILED DESCRIPTION

Figure 1:
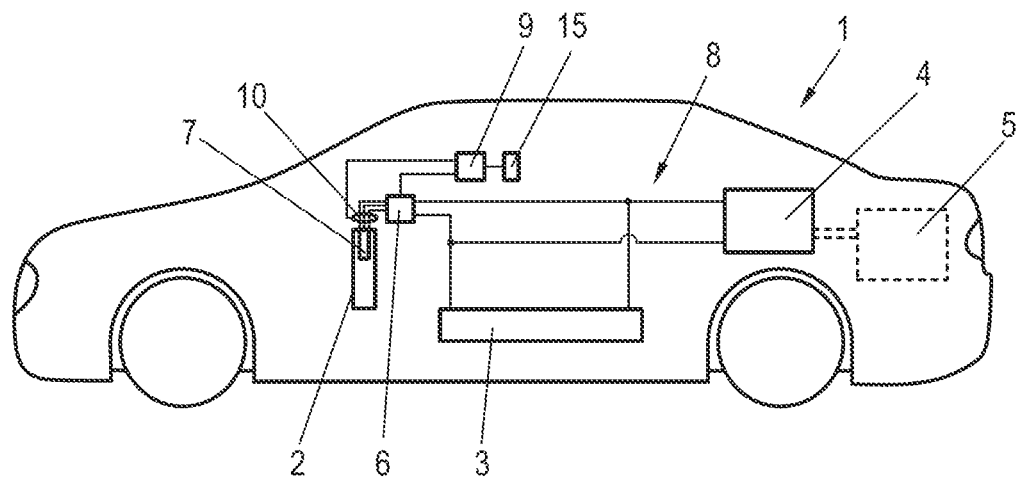
FIG. 1 shows a schematic side view of an embodiment of a motor vehicle.

FIG. 1 shows an embodiment of a motor vehicle 1. The motor vehicle 1 comprises at least one electromechanical actuator 2, which is designed as an active suspension damper. The motor vehicle 1 further comprises an energy storage device 3 and an electric traction motor 4. The motor vehicle 1 may be designed as a fully electric motor vehicle, so that it can only be moved via the traction motor 4. Alternatively, it is also possible for the motor vehicle 1 to be designed as a hybrid electric motor vehicle and additionally comprises an internal combustion engine 5, in particular one that is mechanically coupled to the electric traction motor 4.

The electrical energy storage device 3 is connected to the electromechanical actuator 2 via a control mechanism 6, wherein the electromechanical actuator 2 can be operated in actuator operating processes via the energy storage device 3 by means of the control mechanism. For this purpose, the control mechanism 6 can, for example, be designed as an inverter and be connected to an electrical machine 7 of the actuator 2. The electrical machine 7 of the actuator 2 may be designed, for example, as a rotary motor or as a linear motor.

In addition to this, the actuator 2, which is designed, for example, as an adaptive suspension damper, can comprise further components, for example, a spring and/or further mechanical components such as a piston and/or a compressible or extendable linkage, which are not shown in FIG. 1 for the sake of clarity.

The energy storage device 3 and the control mechanism 6 are connected to each other via an onboard electrical system of the motor vehicle. Depending on the voltage level of the energy storage device, this may be, for example, a 12V grid, a 48V grid or a high-voltage onboard electrical system. It is possible that the control mechanism comprises a DC/DC converter to change the voltage level of the onboard electrical system 8 for the operation of the actuator 2 or alternatively of the electrical machine 7 of the actuator 2. The actuator 2 or alternatively the electrical machine 7 of the actuator 2 is connected to the energy storage device 3 via the onboard electrical system 8.

In addition to actuator operation of the actuator 2 at actuator operation operating points set via the control mechanism 6, it is also possible to feed electrical power from the actuator 2 via the control mechanism 6 into the electrical energy storage device 3. The deflection or movement path of the suspension or alternatively of the actuator 2, which is designed as an adaptive suspension damper, determines the direction of force of the mechanical power and thus whether there is a feed-in of current into the onboard electrical system 8 or is drawn from the onboard electrical system 8.

A feed-in of current occurs, for example, when the actuator 2, which is designed as an active suspension damper, compresses due to unevenness of the ground, wherein the mechanical power absorbed by the actuator 2 is converted into electrical power, which is then fed into the energy storage device 3. This is, however, undesirable since the electrical power generated in this way must be held in reserve in the total capacity of the energy storage device 3 so that no overloading of the energy storage device 3 and/or the onboard electrical system 8 of the motor vehicle 1 connected to the energy storage device 3 occurs during the feed-in processes via the actuator 2.

In order to reduce this reserve in the total capacity of the energy storage device and/or to be able to dispense with this reserve completely, the motor vehicle 1 further comprises a control device 9 which is designed to set a feed-in operating point of the actuator 2 at the start of a feed-in process by the actuator 2 in which process a feed-in efficiency is 50% or less. The feed-in efficiency herein refers to the ratio of the electrical power generated by the actuator 2 to the mechanical power acting on the actuator 2. Accordingly, the efficiency can also be understood as the ratio between the electrical energy generated by actuator 2 and the mechanical energy absorbed via the actuator.

In order to be able to detect the start of a feed-in process, the control device 9 is connected to a means of detection 10 of the motor vehicle 1. The means of detection 10 is arranged to measure a current generated by the actuator 2 in a feed-in process. For this purpose, the means for measuring the current can, for example, determine the current direction and/or the amplitude of phase currents flowing between the control mechanism 6 and the electrical machine 7. In this way, it can be determined whether there is a feed-in of current into the onboard electrical system 8 or alternatively the energy storage device 3 or a current draw from the onboard electrical system 8 or alternatively the energy storage device 3. In particular, the means of detection 10 can also be used when setting an actuator operation operating point, so that a means of detection that is also used elsewhere can be used for detecting the start of the feed-in process.

Figure 2:
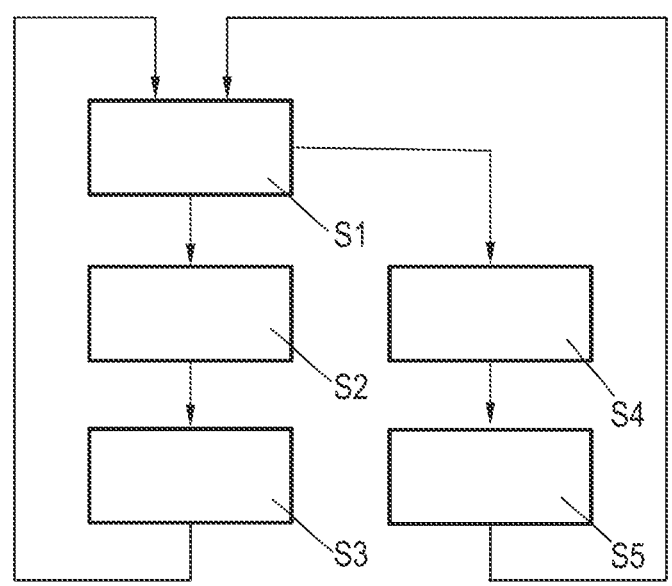
FIG. 2 shows a block diagram of an embodiment of a method.

FIG. 2 shows a flow diagram of an example method. Step S1 therein represents the initial state of the process.

In step S2, the detection of the start of a feed-in process by the actuator 2 is carried out by means of a measurement of current by the means of detection 10. The start of a feed-in process can occur, for example, when the motor vehicle deflects at the electromechanical actuator 2 during driving due to an unevenness of the ground. Such a deflection of an adaptive suspension damper or other damping devices of the motor vehicle occurs stochastically and cannot be detected by the control device 9 and/or other control devices of the motor vehicle 1.

As a result of the detection of the start of the feed-in process, a feed-in operating point of the actuator 2 in which the feed-in efficiency is 50% or less is set in step S3. The feed-in efficiency is therein, for example, based on the position of the feed-in operating point in a feed-back quadrant when a d/q transformation is used in the operation of the control mechanism 6. The selection of the feed-in operating point can furthermore be made as a function of a damping behavior of the actuator 2 to be set, for example, as a function of a torque to be set by the actuator 2 during the deflection. The damping behavior or alternatively the torque can, for example, be determined by an actuator control device 15 designed as a suspension control device of the motor vehicle 1, for example, as a function of a measured value of the means of detection 10 at the start of the feed-in process, and transmitted to the control device 9 at the start of the detection of the feed-in process in step S2. The feed-in operating point and thus the damping behavior or alternatively the torque as well as the feed-in efficiency of the actuator 2 can then be set via the control mechanism 6. As a result, the low feed-in efficiency does not influence the mechanical behavior of the actuator 2 and the function of an adaptive suspension comprising the actuator 2 is not influenced.

In order to keep the electrical power generated during the feed-in process as low as possible, it may, in particular, be provided that at the set feed-in operating point the feed-in efficiency is 25% or less, in particular 20% or less, 15% or less, 10% or less, 5% or less, 2% or less, or 1% or less. In particular, the feed-in efficiency can also be 0% or at least substantially 0%, so that all or almost all of the mechanical power converted by the actuator 2 in the feed-in process is converted into thermal power.

The thermal power heats the actuator 2 and/or further components of the motor vehicle 1 coupled to the actuator 2, no feed-back into the energy storage 3 takes place. Even at comparatively high mechanical powers, due to the short duration of the deflection process, only a small thermal power or alternatively a small amount of heat is generated, which heat can be absorbed by the thermal capacity of the actuator 2 and/or components coupled to the actuator 2 without causing significant heating of the actuator 2.

To set the operating point of the actuator 2, the control device 9 controls the control mechanism 6 such that the actuator 2 is operated at the feed-in input point during the feed-in process. After the feed-in process is finished, the method returns to the first step S1. The end of the feed-in process can also be determined by the control device 9 via the means of detection.

Furthermore, it is possible that, starting from the state S1, the electromechanical actuator 2 is controlled in an actuator operation. This actuation can be determined, for example, by the actuator control device 15 of the motor vehicle 1, which is designed as a suspension control device, and transmitted to the control device 9 in a step S4. To control the actuator 2 to carry out an actuator operating process, the actuator 2 is then operated in an actuator operation operating point by the control device 9 in a step S5. For this purpose, the control device 9 can control the control mechanism 6 of the actuator 2 to set the actuator operation operating point in the actuator 2. In this case, the actuator has an operating efficiency of 80% or more at the actuator operation operating point. The operating efficiency describes the proportion of the electrical power or energy absorbed by the actuator 2 that is converted into mechanical power or alternatively energy by the actuator 2. After completion of the actuator operation process, the process returns to step S1 and from there can once again run through the steps described above.

It is, in particular, possible that the motor vehicle 1 has more than one electromechanical actuator 2 designed as an active suspension damper. It is also possible that the electromechanical actuator 2 is designed as another type of damping device and/or that the motor vehicle 1 comprises further electromechanical actuators designed as damping devices, which are operated by means of the method described above. In particular, electromechanical actuators can be operated by means of the method which, during operation of the motor vehicle 1, electromechanical actuators exhibit stochastic feed-in processes of a duration of 10 ms or less, and in particular of 1 ms or less, and/or by means of which mechanical powers in the feed-in processes exceed 1 kW or more. It is possible that the control device 9 and the actuator control device 15 are designed as a common control device.

An actuator 2 designed as an active suspension damper can, for example, absorb a mechanical power of 6 kW when driving over a bump in the road during operation of the motor vehicle 1. If a high feed-in efficiency is set, for example 83%, 5 kW of electrical power would be generated and fed into the energy storage device 3. For such energy absorption, a reserve must be provided in the energy storage device 3.

Figure 3:
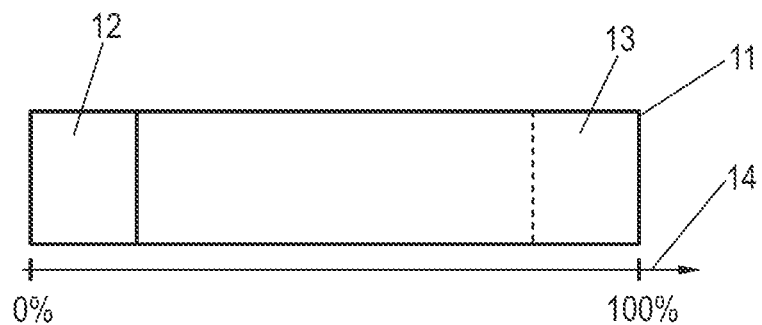
FIG. 3 shows a diagram where the total capacity of an energy storage device is represented.

FIG. 3 schematically shows a total capacity 11 of the energy storage device 3. The total capacity 11 is shown as an area above the axis 14, wherein the state of charge of the energy storage device 3 between 0% and 100% in relation to the total capacity of the energy storage device 3 is schematically plotted on the axis 14.

The total capacity 11 has two reserves 12, 13, wherein a lower reserve 12 limits the maximum electrical energy that can be discharged from the energy storage device 3 in a discharge direction, which is to say limited to a value greater than 0%. The amount of energy retained by the reserve 12 can be used, for example, for the actuator operation of the actuator 2 and/or for the operation of other actuators of the motor vehicle 1. The reserve 13 limits the maximum power that can be fed into the energy storage device 3, for example, in a regenerative operation of the electric traction motor 4, to a value below 100% of the total capacity 11 of the energy storage device 3. The reserve 13, which is available for energy absorption, prevents overcharging of the energy storage device 3 and the onboard electrical system 8 in the event of an occurrence of, in particular, transient feed-back currents in the feed-in processes of the actuator 2. The total capacity held back by the reserves 12, 13 can be based on the maximum temporal average energy to be absorbed or to be provided and may also include a safety margin.

In a method, the electrical power to be absorbed is reduced at the feed-in operating point by using a low feed-in efficiency. With a mechanical power of 6 kW to be absorbed and a feed-in operating point with a feed-in efficiency of 16%, the electrical power generated can be reduced to 1 kW, such that the reserve 13 in the energy storage device can be reduced, since only a small amount of energy can be transferred overall to the energy storage device 3 during the feed-in processes.

The efficiency in the feed-in processes can be selected to be as limited as possible, such that the reserve 13 used to take into account the stochastic feed-in processes by the actuator 2 can be designed to be as small as possible or can be omitted entirely. This increases the usable capacity of the energy storage device 3 which is available for other functions of the motor vehicle 1, for example, for a regenerative operation of the electrical machine 4. The motor vehicle 1 can thereby regenerate more energy during operation of the motor vehicle 1 and use it for other functions, such as a driving operation via the traction motor 3. $CO_2$ emissions can thereby be reduced, in particular, in the case of a motor vehicle 1 with hybrid drive, since the smaller reserve 13 or the elimination of the reserve 13 also makes more energy available for motor operation of the electric traction motor 4. Correspondingly, in a purely electrically driven motor vehicle 1, the maximum range can be increased.

German patent application no. 10 2021 102 352.1, filed Feb. 2, 2021, to which this application claims priority, is hereby incorporated herein by reference in its entirety.

Aspects of the various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A method for operating at least one electromechanical actuator of a motor vehicle, wherein the actuator is designed to convert mechanical power into electrical power during operation of the motor vehicle in stochastic feed-in processes as a function of a feed-in efficiency predetermined by a feed-in operating point of the actuator, which electrical power is fed into an energy storage device of the motor vehicle, wherein the method comprises:
   detecting a start of a feed-in process; and
   at the start of the feed-in process, setting a feed-in operating point of the actuator, wherein the feed-in efficiency is 50% or less.

2. The method according to claim 1, wherein the feed-in efficiency is 25% or less at the set feed-in operating point.

3. The method according to claim 1, wherein the actuator is designed to convert, in actuator operating processes, electrical power into mechanical power during operation of the motor vehicle as a function of an operating efficiency predetermined by an actuator operation operating point of the actuator, wherein an actuator operation operating point in which the operating efficiency is 80% or more is set in each of the actuator operating processes.

4. The method according to claim 1, wherein a duration of the feed-in processes generated by the actuator during operation of the motor vehicle is 10 ms or less.

5. The method according to claim 1, wherein a duration of the feed-in processes generated by the actuator during operation of the motor vehicle is 1 ms or less.

6. The method according to claim 1, wherein mechanical power of 1 kW or more can be converted by the actuator in the feed-in processes.

7. The method according to claim 1, wherein the electromechanical actuator is connected to the energy storage device via a control mechanism, wherein the feed-in operating point of the electromechanical actuator is set by actuating the control mechanism.

8. The method according to claim 1, wherein an adaptive damping device is used as the electromechanical actuator.

9. The method according to claim 8, wherein the adaptive damping device is an adaptive suspension damper.

10. The method according to claim 1, wherein a current measuring device is used to perform the detecting, wherein it is possible for the current measuring device to measure a current which is generated by the actuator during the feed-in process.

11. The method according to claim 1, wherein when the start of a feed-in process is detected by an actuator control device assigned to the actuator, a torque to be set by the actuator is determined, wherein the feed-in operating point is set as a function of the determined torque.

12. A motor vehicle, comprising:
an electromechanical actuator;
an energy storage device;
a detection means; and
a control device;
wherein the actuator is designed to convert mechanical power into electrical power such that the electrical power is fed into the energy storage device during operation of the motor vehicle in stochastic feed-in processes as a function of a feed-in efficiency predetermined by a feed-in operating point of the actuator, wherein a start of a feed-in process is detectable by the detection means, wherein the control device is designed to carry out a method including detecting a start of a feed-in process and, at the start of the feed-in process, setting a feed-in operating point of the actuator, wherein the feed-in efficiency is 50% or less.

13. The motor vehicle according to claim 12, wherein the energy storage device is a traction energy storage device.

14. The motor vehicle according to claim 12, wherein the motor vehicle is a hybrid electric or fully electric motor vehicle.

* * * * *